US011005217B2

(12) United States Patent
Chen et al.

(10) Patent No.: US 11,005,217 B2
(45) Date of Patent: May 11, 2021

(54) ANTI-ELECTROSTATIC DISCHARGE BOARD TO BOARD FLOATING CONNECTOR

(71) Applicant: P-TWO INDUSTRIES INC., Taoyuan (TW)

(72) Inventors: Pi-Miao Chen, Taoyuan (TW); She-Chun Chen, Taoyuan (TW)

(73) Assignee: P-TWO INDUSTRIES INC., Taoyuan (TW)

( * ) Notice: Subject to any disclaimer, the term of this patent is extended or adjusted under 35 U.S.C. 154(b) by 0 days.

(21) Appl. No.: 16/359,740

(22) Filed: Mar. 20, 2019

(65) Prior Publication Data

US 2020/0169043 A1 May 28, 2020

(30) Foreign Application Priority Data

Nov. 23, 2018 (TW) .................................. 107141875

(51) Int. Cl.
| | |
|---|---|
| *H01R 13/648* | (2006.01) |
| *H01R 12/72* | (2011.01) |
| *H01R 12/91* | (2011.01) |
| *H01R 13/502* | (2006.01) |
| *H01R 13/645* | (2006.01) |
| *H01R 13/6587* | (2011.01) |
| *H05K 5/00* | (2006.01) |

(52) U.S. Cl.
CPC ......... *H01R 13/6485* (2013.01); *H01R 12/72* (2013.01); *H01R 12/91* (2013.01); *H01R 13/502* (2013.01); *H01R 13/6453* (2013.01); *H01R 13/6587* (2013.01); *H05K 5/0069* (2013.01)

(58) Field of Classification Search
CPC .............. H01R 13/6485; H01R 13/502; H01R 13/6453; H01R 13/6587; H01R 12/72; H01R 12/91; H05K 5/0069
See application file for complete search history.

(56) References Cited

U.S. PATENT DOCUMENTS

| | | | | |
|---|---|---|---|---|
| 5,556,286 | A * | 9/1996 | Ikesugi ................ | H01R 12/716 439/74 |
| 8,529,282 | B1 * | 9/2013 | Westman ........... | H01R 13/6273 439/345 |
| 9,761,975 | B1 * | 9/2017 | Wang ................... | H01R 12/716 |

* cited by examiner

*Primary Examiner* — Abdullah A Riyami
*Assistant Examiner* — Nader J Alhawamdeh
(74) *Attorney, Agent, or Firm* — Sinorica, LLC

(57) ABSTRACT

The present invention discloses a terminal stand that includes a base body, a movable part, a metal elastic part, a first signal element and a second signal element. The base body includes a first receiving slot and a second receiving slot. The metal elastic part is disposed in the first receiving slot. One end of the metal elastic member includes two first abutments. The first signal element is disposed in a second receiving slot. One end of the first signal element includes a first contact portion and a second abutment. The second signal element is disposed in the second receiving slot. When the movable member is pressed, the movable member drives the two first abutments to move, and the abutment drives the second abutment to move, with the first contact portion leaving the second contact portion, and the signal circuit is in an off-state state.

9 Claims, 3 Drawing Sheets

ANTI-ELECTROSTATIC DISCHARGE BOARD TO BOARD FLOATING CONNECTOR

FIELD OF THE INVENTION

The present invention is related to the technical field of a connector, in particular to an anti-electrostatic discharge board to a board floating connector capable of preventing an electrostatic destruction of an electronic element.

BACKGROUND OF THE INVENTION

The circuit board usually consists of many electronic elements, such as chips, processors, passive components and active components. If the electronic elements fail, the circuit board will be not operated normally.

The most vulnerable condition of the electronic element is the abnormal application of a voltage, such as an overvoltage or an electrostatic. Among them, electrostatic is present in nature and is harder to prevent.

During the circuit board assembly process or operation, the largest possibility for the human to touch is the connector part, which is used to connect different circuit boards or signal sources. Therefore, it is easy for the human body to introduce electrostatic into the circuit board through the connector, thereby causing damage to the electronic element.

Therefore, in view of this, the present invention proposes an anti-electrostatic discharge board to board floating connector, which is used to solve the defect caused by the conventional connector.

SUMMARY OF THE INVENTION

The first objective of the present invention is to provide an anti-electrostatic discharge board to board floating connector, which can release electrostatic by the surrounding shielding member without damaging the electronic element on the circuit board.

The second objective of the present invention of the aforementioned anti-electrostatic discharge board to board floating connector is to provide a shielding member disposed in at least one of the male connection module and the female connection module, which can be effective when combined/operated to release electrostatic through an electrical path consisting of a shielding member and a pin.

In order to achieve the above and other objectives, the present invention provides an anti-electrostatic discharge board to board floating connector that is connected to a circuit board. The anti-electrostatic discharge board to board floating connector includes a case, a board body, a plurality terminal, a pin and a shielding member. The case forms a housing space. The case has a coupling end and a junction end. The coupling end is electrically connected with another connector and the junction end is engaged with the circuit board. The Board body is configured at the housing space. The male terminals are disposed in series on the board body, and one end of the male terminals is adjacent to the coupling end and the other end of the male terminals is electrically connected with the circuit board. The pin is disposed at the outer edge of the case. The pin is electrically connected with the circuit board. The shielding member configured surrounding one part of the case. The shielding member is electrically connected with pin. The shielding member establishes an electrical path with the pin to release electrostatic from the coupling end through the circuit board.

To achieve the above and other objectives, the present invention provides an anti-electrostatic discharge board to board floating connector that is connected to a circuit board. The anti-electrostatic discharge board to board floating connector includes a case, a recessed body, a plurality of female terminals, a pin and a shielding member. The case forms a housing space. The recessed body is configured in the housing space. The recessed body has a coupling end and a junction end. The coupling end is electrically connected with another connector and the junction end is engaged with the circuit board. The female terminals are disposed in series in the inner edge of the recessed body. One end of the female terminals is adjacent to the coupling end and the other end of the female terminals is electrically connected with the circuit board. The pin is disposed at the outer edge of the recessed body. The pin is electrically connected with the circuit board. The shielding member is disposed surrounding a portion of the recessed body. The shielding member is electrically connected with the pin. The shielding member establishes an electrical path with the pin to release electrostatic from the coupling end through the circuit board.

To achieve the above and other objectives, the present invention provides an anti-electrostatic discharge board to board floating connector connected to a first circuit board and a second circuit board. The anti-electrostatic discharge board to board floating connector includes a male connection module and a female connection module. The male connection module further includes a first case, a board body, a plurality of male terminals, a first pin and a first shielding member. The first case forms a first housing space. The first case has a first coupling end and a first junction end, and the first junction end is engaged with the first circuit board. The board body is configured in the housing space. The male terminals are disposed in series in the board body, and one end of the male terminal is adjacent to the first coupling end and the other end of the male terminals is coupled to the first circuit board. The first pin is disposed at the outer edge of the first case, and the first pin is electrically connected with the first circuit board. The first shielding member is disposed surrounding one part of the first case, and the first shielding member is electrically connected with the first pin. The female connection module further includes a second case, a recessed body, a plurality of female terminals, a second pin and a second shielding member. The second case forms a second housing space. The recessed body is configured in the second housing space. The recessed body has a second coupling end and a second junction end. The second coupling end is electrically connected with the first coupling end and the junction end is engaged with the second circuit board. The female terminals are disposed in series in the inner edge of the recessed body, and one end of the female terminals is adjacent to the second coupling end and the other end of the female terminal is electrically connected with the second circuit board. The second pin is disposed at the outer edge of the recessed body, and the second pin is electrically connected with the second circuit board. The second shielding member is disposed surrounding a part of the recessed body, and the shielding member is electrically connected with the second pin. The first shielding member and the first pin establish a first electrical path, the second shielding member and the second pin establishing a second electrical path. After the male connection module is combined with the female connection module, electrostatic is released through the first electrical path and/or the second electrical path to the first circuit board and the second circuit board.

Compared with the prior art, the anti-electrostatic discharge board to board floating connector provided by the present invention can effectively guide the electrostatic through the circuit board on the connector by the electrical path established by the pin and the shielding member, releasing electrostatic without damaging the electronic element on the circuit board. The invention can be assembled or operated with confidence during the assembly process or the operation process and do not need to be concerned about electrostatic affecting the electronic element of the circuit board.

DETAILED DESCRIPTION OF THE PREFERRED EMBODIMENTS

In order to fully understand the objectives, features, and advantages of the present invention, the present invention will be described in detail with the accompanying drawings.

In the present invention, "a" or "an" is used to describe the elements, parts and components described herein. This is done for convenience of description only and provides a general meaning to the scope of the invention. Therefore, unless clearly stated otherwise, the description should be understood to include one, at least one, and the singular also includes the plural.

In the present invention, the terms "comprising", "including", "having", "containing", or the likes are intended to encompass non-exclusive inclusions. For example, a component, structure, article, or device that contains a plurality element is not limited to such elements as listed herein but may include those not specifically listed but which are typically inherent to the component, structure, article, or device. In addition, the term "or" is used to mean an inclusive "or" rather than an exclusive "or" unless clearly stated to the contrary.

Figure 1:
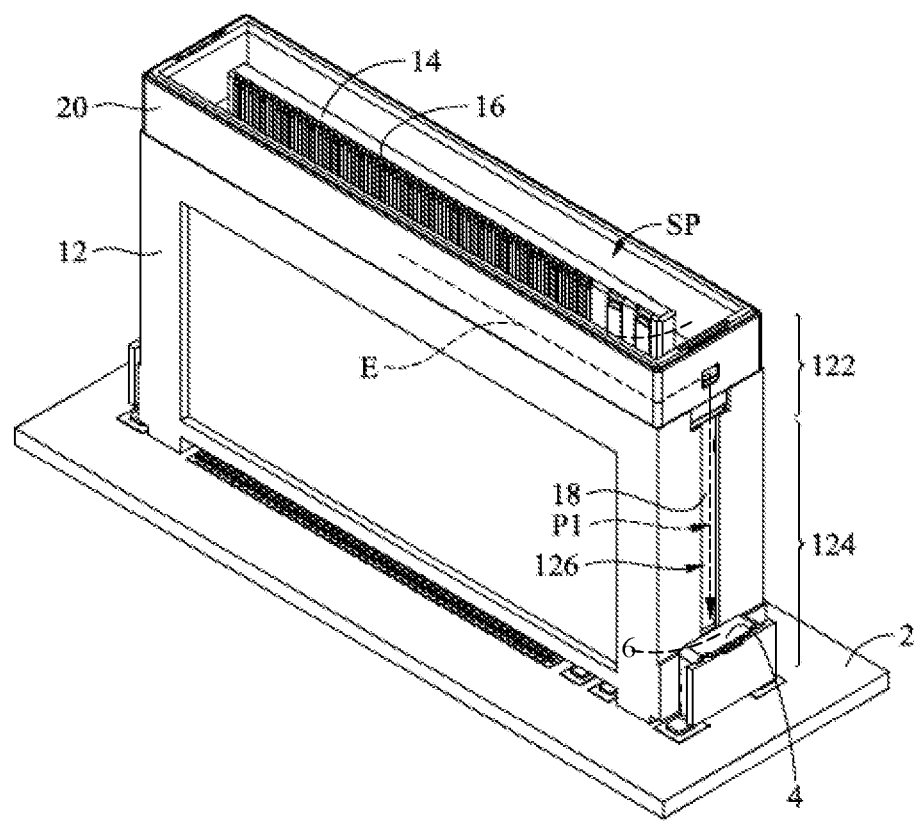
FIG. 1 is a schematic structural view of an anti-electrostatic discharge board to board floating connector according to the first embodiment of the present invention.

Referring to FIG. 1, a schematic structural view of an anti-electrostatic discharge board to board floating connector according to the first embodiment of the present invention is shown. In FIG. 1, an anti-electrostatic discharge board to board floating connector 10 is connected to the circuit board 2.

The anti-electrostatic discharge board to board floating connector 10 includes a case 12, a board body 14, a plurality of male terminal 16, a pin 18, and a shielding member 20.

Case 12 forms a housing space SP. In the present embodiment, case 12 is illustrated by taking a rectangle as an example. Case 12 has a coupling end 122 and a junction end 124. In this embodiment, coupling end 122 is defined to connect one end of another connector (not shown) and junction end 124 is defined to connect one end of circuit board 2. In another embodiment, the outer edge of case 12 forms a trench 126, and trench 126 extends from coupling end 122 to junction end 124 to embed the subsequently mentioned pin 18.

Board body 14 is configured in housing space SP. In this embodiment, board body 14 is disposed at the central portion of housing space SP, and the position of board body 14 is configured relative to the connected end of the other connector.

The male terminals 16 are disposed in series in board body 14, and one end of the male terminals 16 is adjacent to coupling end 122 and the other end of the male terminals 16 is electrically connected with the circuit board 2. In this embodiment, the number of male terminals 16 is illustrated by taking 102 signal contacts and four power contacts as an example. In other embodiments, the number of male terminals can be freely selected.

Pin 18 is configured at the outer edge of case 12, and pin 18 can be electrically connected with the circuit board 2. In the present embodiment, the shape of pin 18 is exemplified by a T shape, that is, a broad upper and a narrow lower shape, and may not be limited to such a shape in other embodiments. In this embodiment, the upper half of pin 18 is disposed under shielding member 20 and electrically connected with shielding member 20.

In the present embodiment, a width in which trench 126 is adjacent to the portion of coupling end 122 and/or junction end 124, is greater than or equal to the remainder of trench 126. The shape of pin 18 can be the same as the shape of trench 126.

The aforementioned shielding member 20 and pin 18 are materials for transmitting electrons and electric charges, such as metal.

Shielding member 20 is disposed surrounding coupling end 122 disposed in case 12, and its width is not limited. In this embodiment, shielding member 20 is adjacent to coupling end 122. Shielding member 20 is electrically connected with pin 18. Shielding member 20 and pin 18 establish an electrical path P1 for releasing the electrostatic E from coupling end 122 from Circuit board 2.

In another embodiment, the anti-electrostatic discharge board to board floating connector 10 may further include bumps 6 and pad 4. The bumps 6 are formed adjacent to the outer edge of junction end 124, and a portion of pin 18 extends along the surface of the bump 6 to circuit board 2. Pad 4 wraps a portion of pin 18 (on the bump 6) over the surface of the bump 6.

Figure 2:
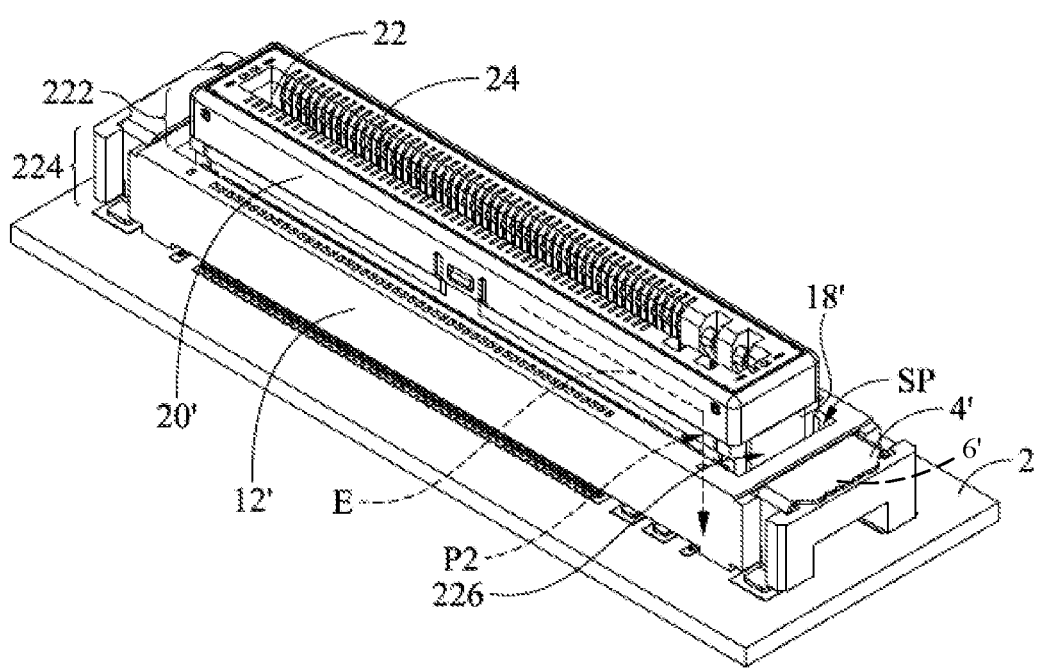
FIG. 2 is a schematic structural view of an anti-electrostatic discharge board to board floating connector according to the second embodiment of the present invention.

Referring to FIG. 2, it is a schematic structural view of an anti-electrostatic discharge board to board floating connector according to a second embodiment of the present invention. In FIG. 2, an anti-electrostatic discharge board to board floating connector 10' is connected to Circuit board 2. The difference compared to the first embodiment is that the first embodiment applies to the male end, and the present embodiment applies to the female end.

The anti-electrostatic discharge board to board floating connector 10' includes a case 12', a recessed body 22, a plurality of female terminal 24, a pin 18', and a shielding member 20'.

Case 12' forms a housing space SP. In the present embodiment, case 12' is illustrated by taking a rectangle as an example.

Recessed body 22 is configured in the housing space SP. The recessed body 22 has a coupling end 222 and a junction end 224. The definition of the coupling end 222 and the junction end 224 is the same as that of the first embodiment, that is, the coupling end 222 is electrically connected with another connector (not shown) and junction end 224 is engaged with circuit board 2. In another embodiment, the outer side edges of recessed body 22 form trench 226, and trench 226 extends from coupling end 222 to junction end 224 to embed pins 18' mentioned later.

Female terminals 24 are disposed in series at the inner edge of recessed body 22. One end of female terminals 24 is adjacent to coupling end 222 and the other end of female terminals 24 is electrically connected with circuit board 2. In this embodiment, the number of female terminals 24 is exemplified by 102 signal contacts and four power contacts. In other embodiments, the number of female terminals can be freely selected.

Pin 18' is configured at the outer edge of recessed body 22. Pin 18' is electrically connected with circuit board 2. In the present embodiment, a width in which trench 226 is adjacent to a portion of coupling end 222 and/or junction end 224, is greater than or equal to the remainder of trench 226. Wherein, the shape of pin 18' may be the same as the shape of trench 226.

Shielding member 20' is electrically connected with pin 18'. Shielding member 20' is disposed surrounding a portion of the recessed bodies 22, and its width is not limited. In the present embodiment, shielding member 20' is adjacent to coupling end 222.

Shielding member 20' and pin 18' establish an electrical path P2 for releasing the electrostatic E from coupling end 222 from circuit board 2.

The aforementioned shielding members 20' and pin 18' may be materials that can transmit electrons and charges, such as metals.

In another embodiment, the anti-electrostatic discharge board to board floating connector 10' further includes bumps 6' and Pad 4'. The bumps 6' are formed adjacent to the outer edge of case 12', and pad 4' secures the bump 6' to circuit board 2.

Figure 3:
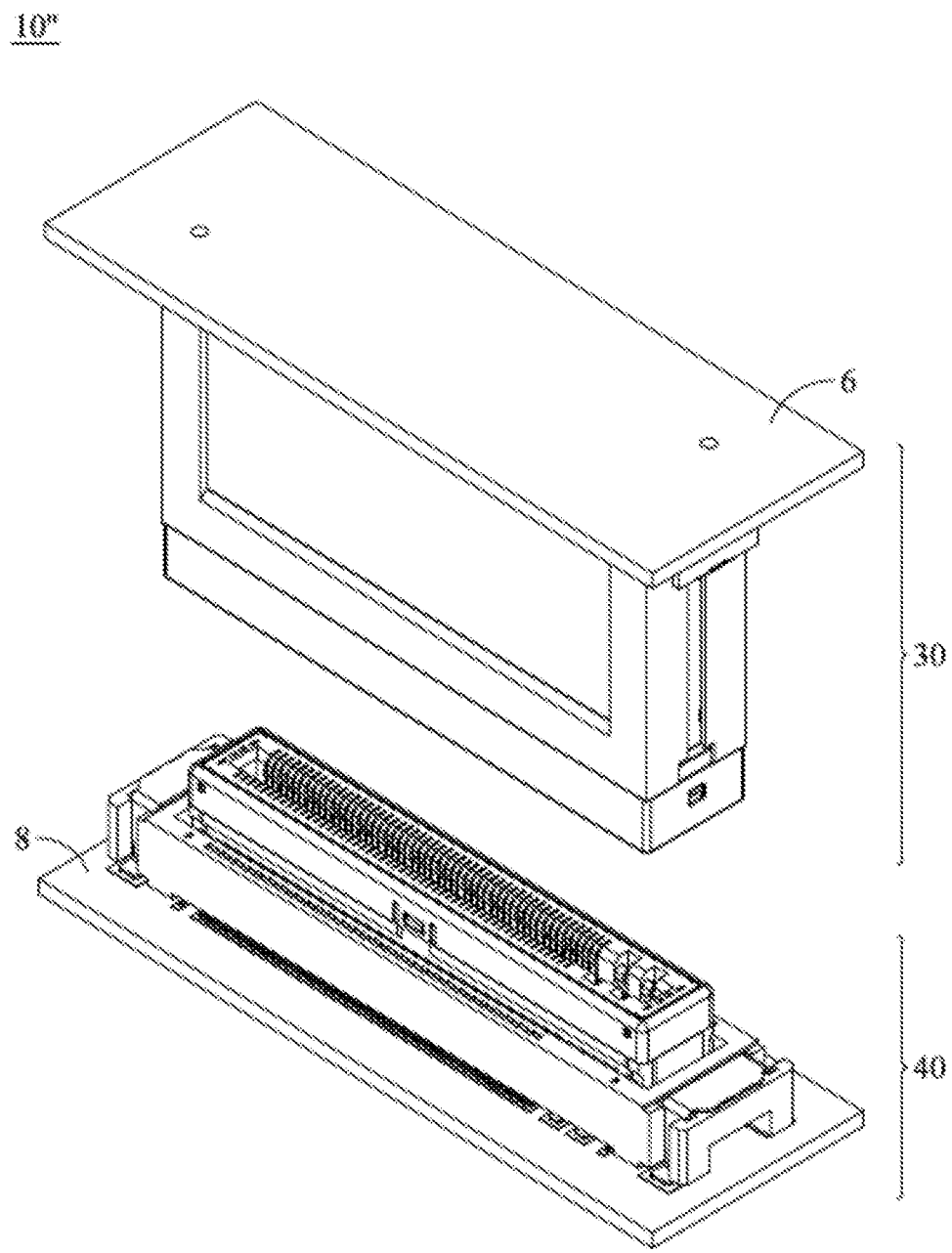
FIG. 3 is a schematic structural view of an anti-electrostatic discharge board to board floating connector according to the third embodiment of the present invention.

Please refer to FIG. 3, which is a structural diagram of an anti-electrostatic discharge board to board floating connector according to a third embodiment of the present invention. In FIG. 3, an anti-electrostatic discharge board to board floating connector 10" is connected to first circuit board 6 and second circuit board 8.

The anti-electrostatic discharge board to board floating connector 10" includes a male connection module 30 and a female connection module 40.

The description of the male connection module 30 can be referred to case 12, board body 14, male terminals 16, pin 18, and shielding member 20 of the first embodiment.

The description of the female connection module 40 can be referred to case 12', recessed body 22, the female terminals 24, pin 18', and shielding member 20' of the second embodiment.

Shielding member 20 of the male connection module 30 establishes an electrical path P1 with pin 18 and the shielding member 20' of the female connection module 40 establishes an electrical path P2 with pin 18'. After the male connection module 30 is combined with the female connection module 40, it lets electrostatic E be released to first circuit board 6 and/or second circuit board 8 through electrical path P1 and electrical path P2.

The invention has been described above in terms of the preferred embodiments, and it should be understood by those skilled in the art that the embodiments are only for describing the invention and not intended to limit the scope thereof. It should be noted that variations and permutations equivalent to the embodiments are intended to be within the scope of the invention. Therefore, the scope of protection of the present invention is defined by the scope of the patent application.

What is claimed is:

1. An anti-electrostatic discharge board to board floating connector,
which is connected to a circuit board, comprising:
a case forming a housing space, the case has a coupling end and a junction end, the coupling end is electrically connected with another connector and the junction end is engaged with the circuit board;
a board body configured in the housing space;
a plurality of male terminals disposed in series in the board body, one end of the male terminals is adjacent to the coupling end and the other end of the male terminals is electrically connected with the circuit board;
a pin configured at the outer edge of the case, the pin is electrically connected with the circuit board; and
a shielding member disposed surrounding a portion of the case, the shielding member is electrically connected with the pin;
wherein, the shielding member establishes an electrical path with the pin in order to release electrostatic coming from the coupling end through the circuit board, the outer side edge of the case forms a trench, the trench is extended from the coupling end to the junction end in order to embed the pin, and a partial width in which the trench is adjacent to at least one of the coupling end and the junction end, is not less than the remainder portion of the trench, wherein the shape of the pin is the same as the shape of the trench.

2. The anti-electrostatic discharge board to board floating connector according to claim 1, further comprise a bump and a pad, the bump is formed adjacent to the outer edge of the junction end, a part of the pin extends to the circuit board along the surface of the bump, the pad covers a portion of the pin on the surface of the bump.

3. The anti-electrostatic discharge board to board floating connector according to claim 1, wherein the shielding member is adjacent to the coupling end.

4. The anti-electrostatic discharge board to board floating connector according to claim 1, wherein the shielding member and the pin have a material for transmitting electrons and electrical charges.

5. The anti-electrostatic discharge board to board floating connector according to claim 3, further comprises a bump and a pad, the bump is formed adjacent to the outer edge of the case and the pad fixes the bump on the circuit board.

6. The anti-electrostatic discharge board to board floating connector according to claim 3, wherein the shielding member is adjacent to the coupling end.

7. The anti-electrostatic discharge board to board floating connector according to claim 3, wherein the shielding member and the pin have a material for transmitting electrons and electrical charges.

8. An anti-electrostatic discharge board to board floating connector, which is connected to a circuit board, comprising:
a case forming a housing space;
a recessed body disposed in the housing space, the recessed body has a coupling end and a junction end, the coupling end is electrically connected with another connector and the junction end is engaged with the circuit board;
a plurality of female terminals disposed in series in the inner edge of the recessed body, and one end of the female terminals is adjacent to the coupling end and the other end of the female terminals is electrically connected with the circuit board;

a pin configured at the outer edge of the recessed body, and the pin is electrically connected with the circuit board; and a shielding member disposed surrounding the part of the recessed body, and the shielding member is electrically connected with the pin;

wherein, the shielding member establishes an electrical path with the pin in order to release electrostatic coming from the coupling end through the circuit board, the outer edge of the recessed body forms a trench, the trench extends from the coupling end to the junction end in order to embed the pin, and a partial width in which the trench is adjacent to at least one of the coupling end and the junction end, is not less than the remainder portion of the trench, wherein the shape of the pin is the same as the shape of the trench.

9. An anti-electrostatic discharge board to board floating connector, which is connected to a first circuit board and a second circuit board, comprising:

a male connection module, contains:

a first case forming a first housing space, the first case has a first coupling end and a first junction end, the first junction end is engaged with the first circuit board;

a board body configured in the housing space;

a plurality of male terminals disposed in series in the board body, one end of the male terminals is adjacent to the first coupling end and the other end of the male terminals is electrically connected with the first circuit board;

a first pin configured at the outer edge of the first case, the first pin is electrically connected with the first circuit board; and a first shielding member disposed surrounding a portion of the first case, the first shielding member is electrically connected with the first pin;

wherein the outer side edge of the first case forms a first trench, the first trench is extended from the first coupling end to the first junction end in order to embed the first pin, and a first partial width in which the first trench is adjacent to at least one of the first coupling end and the first junction end, is not less than the remainder portion of the first trench, wherein the shape of the first pin is the same as the shape of the first trench;

a female connection module, contains:

a second case forming a second housing space;

a recessed body disposed in the second housing space, the recessed body has a second coupling end and a second junction end, the second coupling end is electrically connected with the first coupling end and the second junction end is engaged with the second circuit board;

a plurality of first female terminals disposed in series in the inner edge of the recessed body, and one end of the female terminals is adjacent to the second coupling end and the other end of the female terminals is electrically connected with the second circuit board;

a second pin configured at the outer edge of the recessed body, the second pin is electrically connected with the second circuit board; and a second shielding member disposed surrounding a portion of the recessed body, the second shielding member is electrically connected with the second pin;

wherein the outer edge of the recessed body forms a second trench, the second trench extends from the second coupling end to the second junction end in order to embed the second pin, and a second partial width in which the second trench is adjacent to at least one of the second coupling end and the second junction end, is not less than the remainder portion of the second trench, wherein the shape of the second pin is the same as the shape of the second trench;

wherein, the first shielding member establishes a first electrical path with the first pin, and the second shielding member establish a second electrical path with the second pin, after the male connection module is combined with the female connection module, electrostatic is released through the first electrical path and the second electrical path toward the first circuit board and the second circuit board.

* * * * *